(12) United States Patent
Nonomura (10) Patent No.: US 10,044,329 B2
(45) Date of Patent: Aug. 7, 2018

(54) TRANSMISSION MODULE, ARRAY ANTENNA DEVICE INCLUDING TRANSMISSION MODULE, AND TRANSMISSION DEVICE INCLUDING TRANSMISSION MODULE

(71) Applicant: Mitsubishi Electric Corporation, Chiyoda-ku (JP)

(72) Inventor: Hiroyuki Nonomura, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/525,169

(22) PCT Filed: Jan. 28, 2016

(86) PCT No.: PCT/JP2016/052486
§ 371 (c)(1),
(2) Date: May 8, 2017

(87) PCT Pub. No.: WO2017/010111
PCT Pub. Date: Jan. 19, 2017

(65) Prior Publication Data
US 2017/0331439 A1 Nov. 16, 2017

(30) Foreign Application Priority Data
Jul. 14, 2015 (JP) .................................. 2015-140313

(51) Int. Cl.
*H04B 1/00* (2006.01)
*H03F 3/193* (2006.01)
(Continued)

(52) U.S. Cl.
CPC ......... *H03F 3/1935* (2013.01); *H03F 1/0277* (2013.01); *H03F 3/211* (2013.01);
(Continued)

(58) Field of Classification Search
CPC .. H03F 3/211; H03F 1/0277; H03F 2203/211; H03G 3/3042; H03G 1/0005
(Continued)

(56) References Cited

U.S. PATENT DOCUMENTS

| 8,422,465 B2 * | 4/2013 | Lee | ........................... H04B 7/04 370/335 |
| 8,774,737 B2 * | 7/2014 | Mori | ......................... H01Q 3/26 455/114.3 |

(Continued)

FOREIGN PATENT DOCUMENTS

| EP | 359238 A2 | 3/1990 |
| JP | 54-072653 A | 6/1979 |

(Continued)

OTHER PUBLICATIONS

Takayama et al. Phased Array Antenna Device and Communication System, Jun. 8, 2015, machine translated document of JP-2015106878, pp. 1-22. (Year: 2015).*

(Continued)

*Primary Examiner* — Sonny Trinh
(74) *Attorney, Agent, or Firm* — Oblon, McClelland, Maier & Neustadt, L.L.P.

(57) ABSTRACT

A transmission module includes n oscillator modules and a phase command signal generator. Each of the oscillator modules includes a voltage controlled oscillator and an amplification circuit. The voltage controlled oscillators output transmission high-frequency signals having the same frequency and synchronized among the n oscillator modules by synchronous control based on a common reference signal. The amplification circuits each perform power amplification for the transmission high-frequency signal from a corresponding one of the voltage controlled oscillators and output the resultant signal. Phases of the transmission high-frequency signals synchronized among the n oscillator mod- (Continued)

ules and output from the voltage controlled oscillators are separately controlled according to respective n phase command signals from the phase command signal generator.

19 Claims, 8 Drawing Sheets

(51) Int. Cl.
    *H03F 1/02*     (2006.01)
    *H03F 3/21*     (2006.01)
    *H03G 3/30*     (2006.01)
    *H03F 1/32*     (2006.01)
    *H03G 1/00*     (2006.01)

(52) U.S. Cl.
    CPC ......... *H03G 3/3042* (2013.01); *H03F 1/3205* (2013.01); *H03F 2200/18* (2013.01); *H03F 2203/211* (2013.01); *H03G 1/0005* (2013.01)

(58) Field of Classification Search
    USPC ..................................... 455/23, 42, 139, 260
    See application file for complete search history.

(56) References Cited

U.S. PATENT DOCUMENTS 8,914,068 B2     12/2014     Hayashi et al.
2012/0319746 A1     12/2012     Hayashi et al.

FOREIGN PATENT DOCUMENTS

| JP | 02-095002 A | 4/1990 |
| JP | 2008-053837 A | 3/2008 |
| JP | 5377750 B2 | 12/2013 |
| JP | 2015-106878 A | 6/2015 |

OTHER PUBLICATIONS

International Search Report dated Mar. 29, 2016 in PCT/JP2016/052486, filed Jan. 28, 2016.

* cited by examiner

TRANSMISSION MODULE, ARRAY ANTENNA DEVICE INCLUDING TRANSMISSION MODULE, AND TRANSMISSION DEVICE INCLUDING TRANSMISSION MODULE

TECHNICAL FIELD

The present disclosure relates to a transmission module, an array antenna device including the transmission module, and a transmission device including the transmission module, and more particularly to a configuration of a transmission module used for transmission not employing a baseband signal.

BACKGROUND ART

In recent years, semiconductor high-power elements such as a GaN-FET (Field Effect Transistor) as a power amplification element have come into widespread use. Due to advantages such as a long life, such semiconductor high-power elements have been increasingly applied also to a transmission system including an amplifier/oscillator constituted using a vacuum tube device. However, as compared with a vacuum tube device, the output power is relatively small by a semiconductor element alone, so that power combining is indispensable for a transmission device for a high-power application using a semiconductor.

There is an array antenna device as means for implementing a high-power transmission device using a semiconductor. Various configurations of array antenna devices have been proposed until now. For example, Japanese Patent No. 5377750 (PTD 1) discloses an array antenna device configured to combine transmission high-frequency signals combined from a plurality of (n) local oscillation signals. According to the array antenna device in PTD 1, the SN ratio can be improved by n times higher than that in the configuration in which the transmission high-frequency signal generated from a single local oscillation signal is amplified by n times.

CITATION LIST

Patent Document

PTD 1: Japanese Patent No. 5377750

SUMMARY OF INVENTION

Technical Problem

In the application other than communication by radar or the like not employing a baseband signal, it is desired to reduce the size of a transmission array antenna for the purpose of implementing a high-power semiconductor transmission device. Such size reduction of the device can contribute also to cost reduction.

However, the array antenna device in PTD 1 is intended to be used for transmission employing a baseband signal as communication information. Accordingly, in this array antenna device, a transmission module is also configured to perform a frequency conversion by mixing a baseband signal and a local oscillation signal. Thus, in the application limited to transmission not employing a baseband signal, a large number of components are required, which leads to increased size and cost.

Also in the array antenna device, radiation directivity control, that is, beam control, is performed by the phases among the high-frequency signals having the same frequency that are transmitted from a plurality of element antennas. Thus, for the transmission application by radar or the like not employing a baseband signal, there is a generally used configuration in which a single high-frequency signal equivalent to a transmission frequency is distributed to a plurality of transmission modules corresponding to the respective element antennas, and a phase shifter for beam control is disposed in each of the transmission modules. However, such a configuration may increase the size and cost of the circuit used for distribution of a high-frequency signal. Furthermore, the power loss during distribution and the power loss in the phase shifter may increase the power amplification factor in each transmission module, which also causes a problem that the amplifier is increased in size. Thus, it becomes necessary to consider the configuration of a transmission module suitable for transmission not employing a baseband signal.

The present disclosure has been made to solve the above-described problems. An object of the present disclosure is to provide a compact, low-cost and low-loss transmission module configuration that is suitable for transmission not employing a baseband signal.

Solution to Problem

A transmission module according to an aspect of the present disclosure includes a plurality of oscillator modules and a phase command signal generator. Each of the plurality of oscillator modules is configured to receive a common reference signal and output a corresponding one of a plurality of transmission signals. The phase command signal generator is configured to separately generate a plurality of phase command signals each corresponding to one of the plurality of transmission signals, and output each of the plurality of phase command signals to a corresponding one of the plurality of oscillator modules. Each of the plurality of oscillator modules includes a voltage controlled oscillator and an amplification circuit. The voltage controlled oscillator is configured to output a corresponding transmission signal of the plurality of transmission signals based on the reference signal and a corresponding phase command signal of the plurality of phase command signals. The amplification circuit is configured to amplify power of the corresponding transmission signal output from the voltage controlled oscillator. Furthermore, the voltage controlled oscillator is configured to output the plurality of transmission signals such that, by synchronous control based on the reference signal, the plurality of transmission signals have a common frequency among the plurality of oscillator modules, and have phases separately controlled among the plurality of oscillator modules according to the corresponding phase command signal.

By providing such a configuration, the transmission module can output a plurality of transmission signals that are synchronously controlled based on a common reference signal without having to provide a circuit element for distributing a high-frequency transmission signal. As a result, by the configuration in which the power amplification factor in the amplification circuit is suppressed and the number of circuit elements is reduced, it becomes possible to output a plurality of transmission signals having the same frequency and having the relative phase controlled. Particularly, since a transmission signal having a high frequency does not have to be distributed at the stage preceding the oscillator module, a compact, low-cost and low-loss circuit configuration can be implemented.

Advantageous Effects of Invention

According to the present disclosure, it becomes possible to implement a compact, low-cost and highly-efficient transmission module configuration that is suitable for transmission by radar or the like not employing a baseband signal. Furthermore, a compact and low-cost array antenna device and transmission device can be configured using this transmission module.

DESCRIPTION OF EMBODIMENTS

The embodiments of the present disclosure will be hereinafter described in detail with reference to the accompanying drawings. In the following description, the same or corresponding components are designated by the same reference characters, and description thereof will not be basically repeated.

First Embodiment

Figure 1:
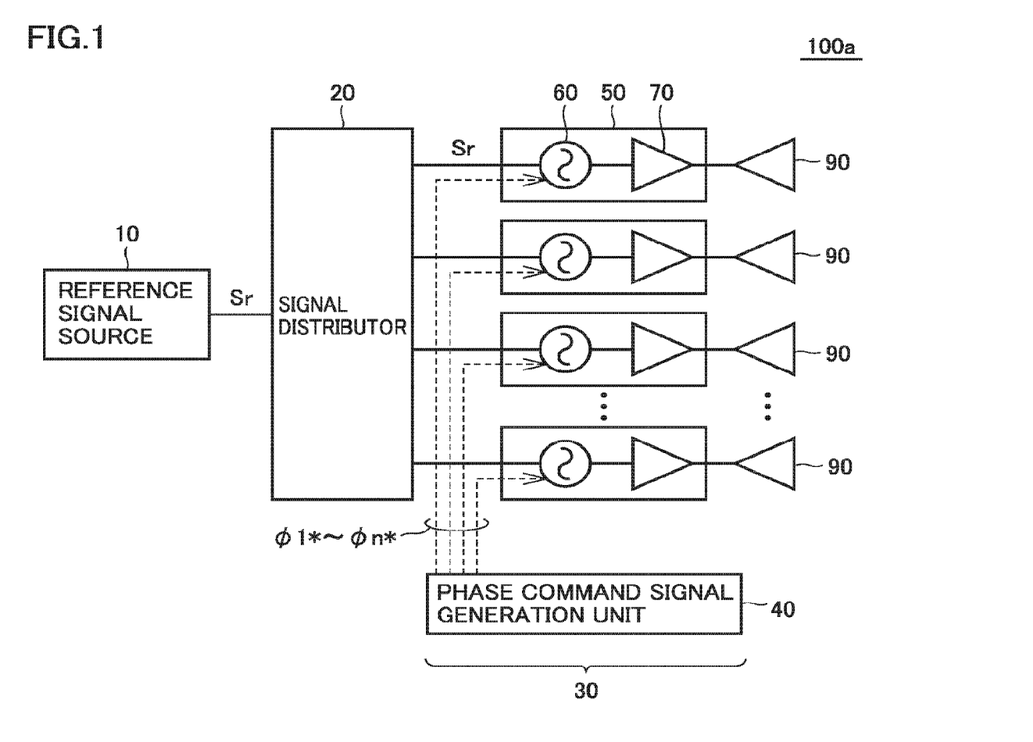
FIG. 1 is a block diagram illustrating the configuration of an array antenna device configured to include a transmission module according to an embodiment of the present disclosure.

FIG. 1 is a block diagram illustrating the configuration of an array antenna device 100a configured to include a transmission module according to an embodiment of the present disclosure.

Referring to FIG. 1, array antenna device 100a includes a reference signal source 10, a signal distributor 20, a transmission module 30, and a plurality of element antennas 90.

Transmission module 30 includes a phase command signal generator 40 and a plurality of oscillator modules 50. In the present embodiment, transmission module 30 is configured to include n (n: 2 or more natural numbers) oscillator modules 50. In total, n element antennas 90 are provided so as to correspond to respective oscillator modules 50.

Reference signal source 10 outputs a reference signal Sr. Reference signal Sr corresponds, for example, to a reference clock of approximately several MHz to several hundred MHz. Signal distributor 20 branches reference signal Sr and transfers the branched signal to each of oscillator modules 50.

Each of oscillator modules 50 includes a voltage controlled oscillator 60 and an amplification circuit 70. Each of oscillator modules 50 outputs a transmission signal having a high frequency (for example, GHz order) (which will be hereinafter also referred to as a "transmission high-frequency signal"). The plurality of element antennas 90 are provided in an array arrangement so as to correspond to a plurality of (n) oscillator modules. Each of element antennas 90 is arranged so as to propagate the transmission high-frequency signal from a corresponding one of oscillator modules 50 into space. Element antenna 90 corresponds to one embodiment of a "radiation element".

To each of oscillator modules 50, a common reference signal Sr is transferred through signal distributor 20. Voltage controlled oscillators 60 output transmission high-frequency signals having the same frequency under synchronous control based on reference signal Sr. Furthermore, in n oscillator modules 50, the phases of the transmission high-frequency signals from n voltage controlled oscillators 60 are controlled according to respective phase command signals φ1* to φn* from phase command signal generator 40. In the following description explaining the configuration and the like common to n oscillator modules 50, phase command signals φ1* to φn* are also collectively represented as a phase command signal φ*.

For example, by a PLL (Phase Locked Loop) receiving reference signal Sr as an input signal, each of voltage controlled oscillators 60 performs synchronous control so as to output a high-frequency signal synchronized with reference signal Sr. In this case, in n oscillator modules 50, voltage controlled oscillators 60 output transmission high-frequency signals having the same frequency. Furthermore, for each of the transmission high-frequency signals, the phase difference relative to the reference phase given by reference signal Sr is controlled according to phase command signal φ* for each oscillator module 50. Accordingly, the relative phase among the n transmission high-frequency signals can be controlled freely in accordance with setting of phase command signals φ1* to φn*.

In each of oscillator modules 50, amplification circuit 70 amplifies a transmission high-frequency signal output from voltage controlled oscillator 60. The transmission high-frequency signal amplified by amplification circuit 70 is transferred to element antenna 90 as an output from oscillator module 50.

In array antenna device 100a, a plurality of (n) element antennas 90 transmit transmission high-frequency signals from the plurality of (n) oscillator modules 50 toward space. When the relative phase of the plurality of (n) transmission high-frequency signals is controlled by phase command signals φ1* to φn* from phase command signal generator 40, the shape and the direction of a transmission beam from each of the plurality of element antennas 90 can be freely controlled. Thereby, array antenna device 100a can output a transmission signal not employing a baseband signal. For example, array antenna device 100a can transmit a beam for a radar application.

Figure 2:
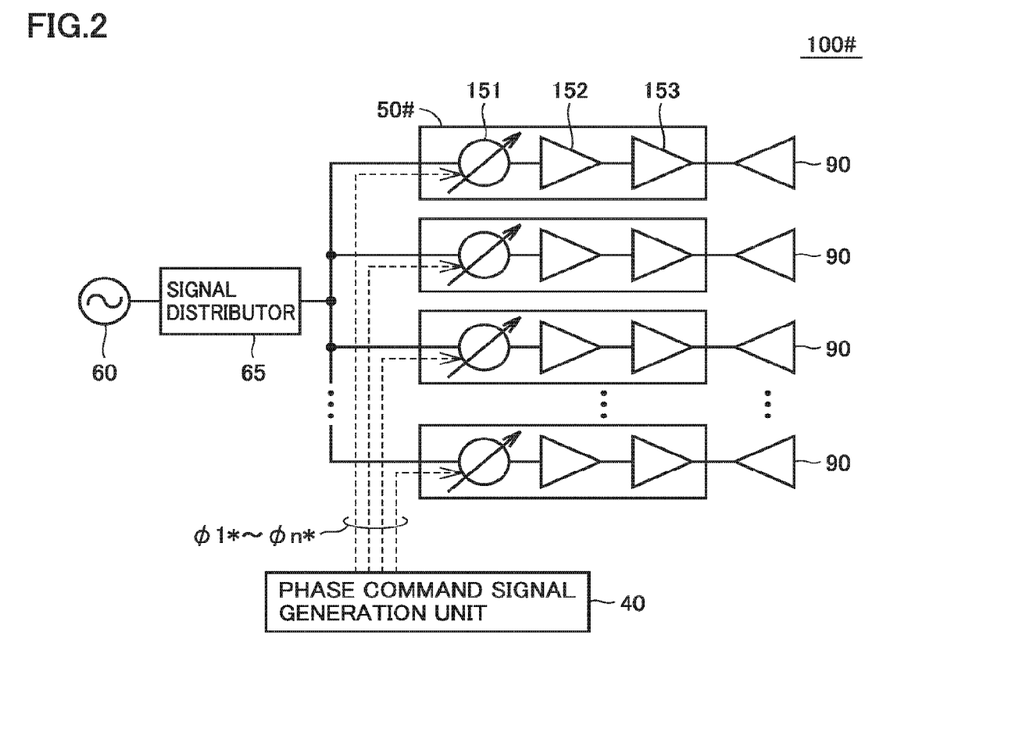
FIG. 2 is a block diagram illustrating the configuration of a commonly-used array antenna device and transmission module shown as a comparative example.

FIG. 2 shows the configuration of a commonly-used array antenna device 100# shown as a comparative example.

Referring to FIG. 2, array antenna device 100# in a comparative example includes a voltage controlled oscillator 60, a signal distributor 65, a plurality of oscillator modules 50#, a plurality of element antennas 90, and a phase command signal generator 40.

Also in array antenna device 100#, n oscillator modules 50# and n element antennas 90 are provided. As in FIG. 1, phase command signal generator 40 also generates phase command signals φ1* to φn* each used for controlling the shape and the direction of a transmission beam from a corresponding one of the plurality of element antennas 90.

Voltage controlled oscillator 60 outputs a transmission high-frequency signal. Signal distributor 65 distributes a transmission high-frequency signal from voltage controlled oscillator 60 to each of the plurality of oscillator modules 50#. Thereby, each of the transmission high-frequency signals having the same frequency is input into a corresponding one of oscillator modules 50#, as a common signal.

Each of oscillator modules 50# includes a phase shifter 151, amplifiers 152 and 153. In each of n oscillator modules 50#, phase shifter 151 controls the phase of the input transmission high-frequency signal according to a corresponding one of phase command signals φ1* to φn* from phase command signal generator 40, and outputs the controlled signal. As a result, n transmission high-frequency signals output from n phase shifters 151 have the same frequency and have phases separately controlled according to phase command signals φ1* to φn* in the same manner as with the n transmission high-frequency signals output from n voltage controlled oscillators 60 in FIG. 1.

In each of oscillator modules 50#, amplifiers 152 and 153 each amplify the power of the transmission high-frequency signal output from phase shifter 151, and output the amplified power to a corresponding element antenna 90. As a result, also in array antenna device 100# in the comparative example, n element antennas 90 can output transmission beams obtained by n transmission high-frequency signals as in array antenna device 100a (FIG. 1).

Array antenna device 100# in the comparative example is configured to input each of transmission high-frequency signals having the same frequency into a corresponding one of oscillator modules 50#, as a common signal. Accordingly, signal distributor 65 for distributing a high-frequency signal to each of oscillator modules 50# is increased in size, thereby also increasing power loss.

Furthermore, on the assumption that the power of the transmission high-frequency signal output from voltage controlled oscillator 60 is defined as P, the power of the transmission high-frequency signal input into each of oscillator modules 50# is decreased to P/n. Thus, in each of oscillator modules 50#, the power amplification factor obtained by amplifiers 152 and 153 needs to be raised. Furthermore, in each of oscillator modules 50#, phase shifter 151 for phase control needs to be arranged.

In contrast, in array antenna device 100a (FIG. 1) according to the first embodiment, a reference signal that is lower in frequency than the transmission high-frequency signal is input in common into each of oscillator modules 50. Thus, as compared with signal distributor 65 in the comparative example, signal distributor 20 is simplified in configuration, and therefore, can be reduced in size. In addition, depending on the conditions of reference signal Sr, merely a wiring line branching may allow transmission of a common reference signal to each of oscillator modules 50. In this case, arrangement of signal distributor 20 can be eliminated.

Furthermore, in each of oscillator modules 50, voltage controlled oscillator 60 outputs a transmission high-frequency signal. Accordingly, even if the power of reference signal Sr is decreased due to distribution, the power amplification factor of the transmission high-frequency signal is not influenced thereby. As a result, the voltage amplification factor obtained by amplification circuit 70 in oscillator module 50 can be set smaller than the power amplification factor obtained by amplifiers 152 and 153 in oscillator module 50#.

Furthermore, voltage controlled oscillators 60 are synchronously controlled based on common reference signal Sr as an input among n oscillator modules 50. Accordingly, phase shifter 151 does not have to be provided as in oscillator module 50#.

In this way, as compared with array antenna device 100# in the comparative example, array antenna device 100a according to the first embodiment can be configured in such a manner that the power amplification factor is suppressed while the number of circuit elements is decreased in each of oscillator modules 50 configured to output a high-frequency signal for transmission not employing a baseband signal. Furthermore, since distribution of a high-frequency signal is not required at a stage preceding each oscillator module 50, a compact, low-cost and low-loss circuit configuration can be implemented. As a result, it becomes possible to implement a compact, low-cost and low-loss transmission module configuration that is suitable for transmission by radar or the like not employing a baseband signal.

Then, the configuration of oscillator module 50 in transmission module 30 according to the present embodiment will be hereinafter described in greater detail.

Figure 3:
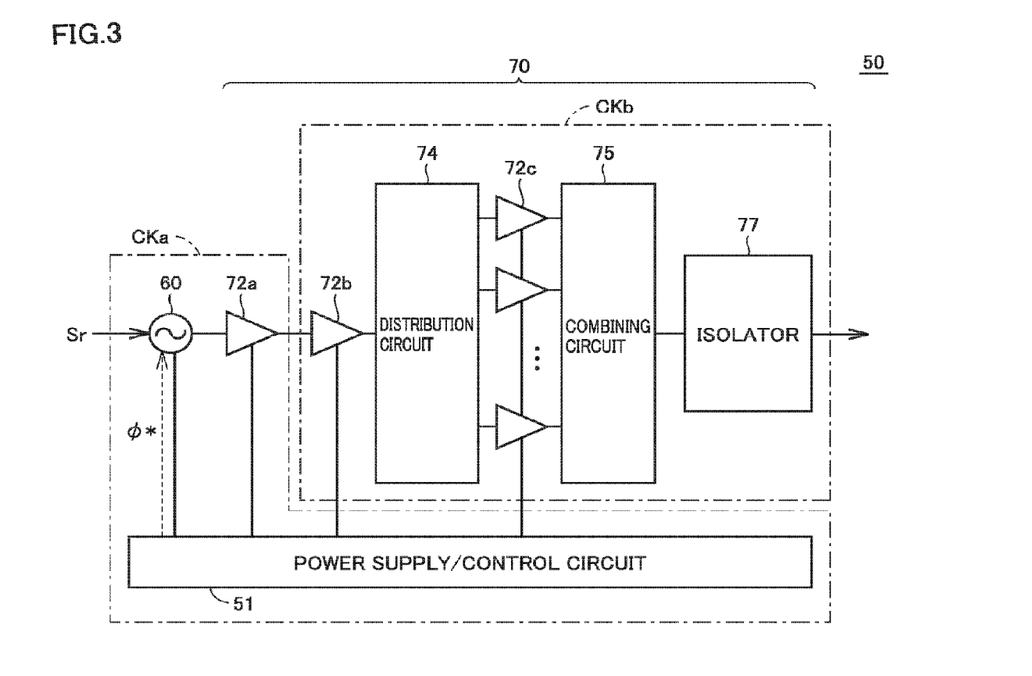
FIG. 3 is a circuit diagram specifically illustrating a configuration example of an oscillator module shown in FIG. 1.

FIG. 3 is a circuit diagram for illustrating a configuration example of oscillator module 50 shown in FIG. 1.

Referring to FIG. 3, oscillator module 50 includes power supply/control circuitry 51, a voltage controlled oscillator 60, and an amplification circuit 70. In each oscillator module 50, power supply/control circuitry 51 is represented collectively as one block including a power supply circuit for supplying electric power to each component element and a control circuit for generating a control command signal for each component element.

Voltage controlled oscillator 60 operates with electric power received from power supply/control circuitry 51. Voltage controlled oscillator 60 receives an input of a reference signal Sr that is output from reference signal source 10 and distributed by signal distributor 20. This reference signal Sr is common among n oscillator modules 50 shown in FIG. 1.

Voltage controlled oscillator 60 outputs a transmission high-frequency signal that is controlled in synchronization with reference signal Sr by PLL or the like. As described above, the phase of the transmission high-frequency signal is controlled according to a phase command signal φ* for each oscillator module 50.

Amplification circuit 70 includes amplifiers 72a and 72b arranged in series, a distribution circuit 74, a plurality of amplifiers 72c arranged in parallel, a combining circuit 75, and an isolator 77. Amplifiers 72a, 72b and a plurality of amplifiers 72c operate with the electric power from power supply/control circuitry 51.

Each of amplifiers 72a and 72b performs power amplification for a transmission high-frequency signal output from voltage controlled oscillator 60. Distribution circuit 74 distributes the output signal of amplifier 72b to the plurality of amplifiers 72c. Each of amplifiers 72c performs power amplification for the transmission high-frequency signal input from distribution circuit 74 and outputs the resultant signal. Combining circuit 75 combines the transmission high-frequency signals output from the plurality of amplifiers 72c. Distribution circuit 74 and combining circuit 75 can be formed, for example, using a 90-degree hybrid circuit.

As in the configuration example in FIG. 3, power amplification is performed by the plurality of amplifiers 72c using distribution circuit 74 and combining circuit 75, so that the output power can be readily secured. Accordingly, when the transmission high-frequency signal does not need to have much output power, arrangement of distribution circuit 74 and combining circuit 75 may be eliminated and only a single amplifier 72c may be arranged. Furthermore, amplifiers 72a and 72b can also be formed by a one-stage amplifier.

Isolator 77 is provided for protecting amplifier 72c from excessive output reflection from element antenna 90. In addition, isolator 77 can also be configured in such a manner that a plurality of isolators each having small withstand power are arranged in intermediate stages of combining power in combining circuit 75.

Oscillator module 50 is separated into two circuit blocks CKa and CKb during mounting. Circuit block CKa includes a voltage controlled oscillator 60 and power supply/control circuitry 51. Furthermore, one of amplifiers 72a and 72b (for example, amplifier 72a) can be arranged so as to be included in circuit block CKa. In the configuration example in FIG. 3, amplifier 72a of amplifiers 72a and 72b provided in a plurality of stages is included in circuit block CKa. This circuit block CKa is provided with: components in a circuit portion including a large number of control wiring lines for PLL; and components in a relatively small power portion.

On the other hand, circuit block CKb includes at least one of amplifiers 72a and 72b (for example, amplifier 72b), a distribution circuit 74, an amplifier 72c, a combining circuit 75, and an isolator 77. Circuit block CKb includes a component having a relatively high power portion and, due to its significant heat generation, requiring a heat radiation structure.

Figure 4:
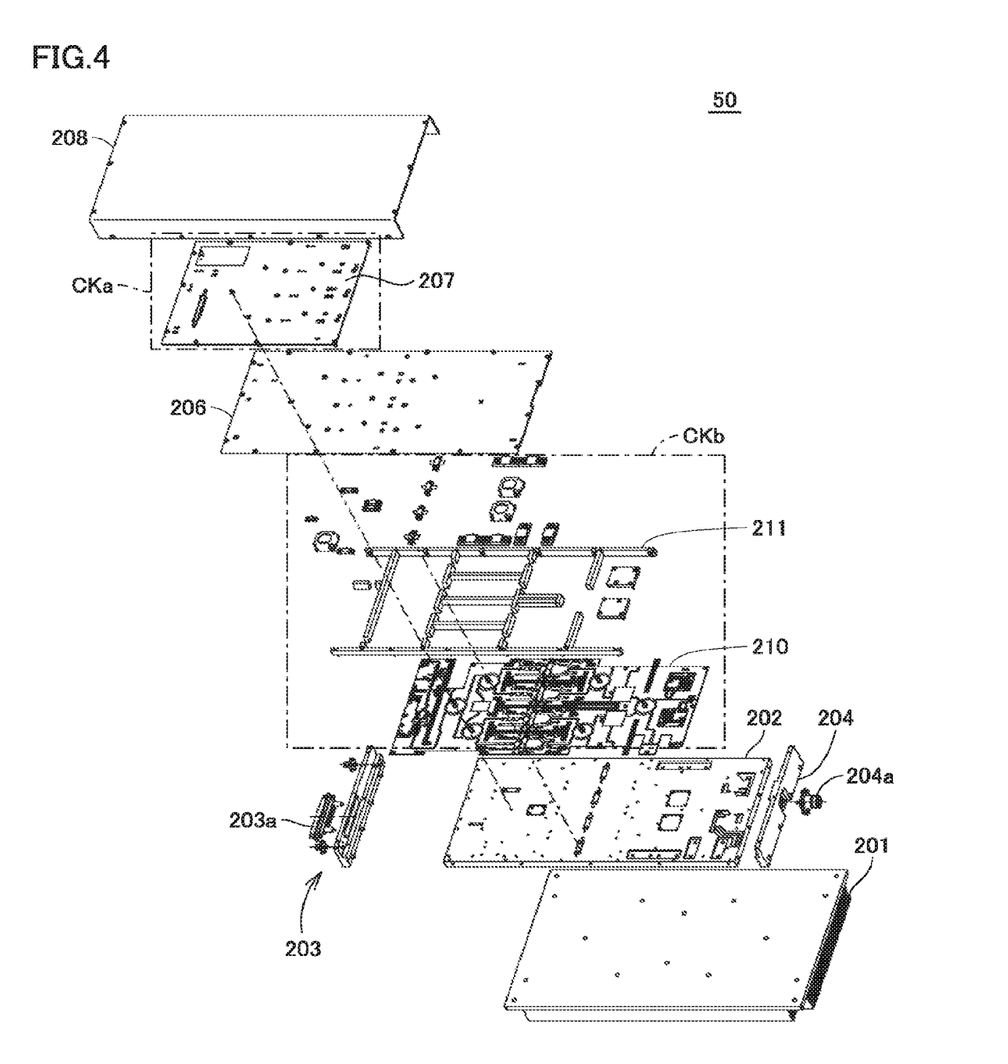
FIG. 4 is a perspective view for illustrating an example of the mounting structure of the oscillator module shown in FIG. 3.

FIG. 4 shows a perspective view for illustrating a mounting example of oscillator module 50 whose components are categorized into circuit blocks CKa and CKb.

Referring to FIG. 4, oscillator module 50 is implemented in a two-story structure obtained by stacking, as an integrated substrate, a substrate 207 having circuit block CKa mounted thereon and a substrate 210 having circuit block CKb mounted thereon.

Substrate 207 having circuit block CKa mounted thereon is fabricated as a substrate integrally provided with high-frequency signal circuitry dealing with a small signal, such as power supply/control circuitry 51, voltage controlled oscillator 60 including a large number of control wiring lines due to being PLL-controlled, amplifier 72a in the first stage, and the like. Thereby, size reduction and wiring-line connection are facilitated.

Since substrate 210 having circuit block CKb mounted thereon is provided with a circuit element causing significant heat generation due to high output power, this substrate 210 requires a heat radiation structure. Thus, substrate 210 is arranged in the first-floor portion of the structure. Furthermore, substrate 210 is arranged on a metal base 202 to which a heat radiation fin 201 is attached. Thereby, the heat generated from the circuit elements included in circuit block CKb can be dissipated from heat radiation fin 201. In this case, when heat radiation fin 201 is configured in a separable structure, the cooling method can be changed into a water-cooling method or the like as required.

Substrate 210 mounted on metal base 202 is covered by an input-side connector plate 203 and an output-side connector plate 204 that are made of metal and a metal plate 206. Furthermore, a longitudinal wall formed of a sponge 211 having conductivity is provided on a GND pattern of substrate 210.

Thereby, the shield structure for inter-element isolation that is required between circuit block CKa (a substrate 207) and circuit elements on circuit block CKb emitting large output power is implemented by (i) the longitudinal wall formed of sponge 211 and (ii) input-side connector plate 203, output-side connector plate 204 and metal plate 206 for covering the structure in the first floor portion. In other words, the longitudinal wall formed of sponge 211 is formed so as to have a height required for isolation along the direction in which substrates 210 and 207 are stacked.

By providing such a shield structure, the engraved structure of metal base 202 can be simplified. Furthermore, in any portion where a GND pattern is provided on substrate 210, the shape and the size of the space that needs to be shielded can be flexibly changed.

In addition, input-side connector plate 203 and output-side connector plate 204 are not only configured to have a shield structure but also provided with a connector serving as an input/output interface from the outside. Specifically, input-side connector plate 203 is provided with a connector 203a for receiving an input of reference signal Sr. Output-side connector plate 204 is provided with a connector 204a for outputting a transmission high-frequency signal to element antenna 90.

Circuit elements (circuit block CKa) mounted on substrate 207 and circuit elements (circuit block CKb) mounted on substrate 210 are connected via a wiring line passing through each hole that is provided in metal plate 206 and that has a size not influencing isolation. In this case, a covered wire is used for a wiring line through which a power supply and a control signal are transmitted. On the other hand, it is preferable that a coaxial wire is used for a wiring line through which a high-frequency signal is transmitted.

The circuit structure (two-story structure) of oscillator module 50 formed on metal base 202 is covered by a metal cover 208. Metal cover 208 is attached as an isolation structure for circuit block CKa in addition to the purpose of protecting the circuit structure from the impact and the like received from outside.

According to the example of the mounting structure in FIG. 4, each oscillator module 50 forming the transmission module according to the first embodiment can be efficiently mounted. In the example in FIG. 4, substrate 210 corresponds to the "first substrate" and substrate 207 corresponds to the "second substrate".

(Modification of Configuration of Oscillator Module)

Figure 5:
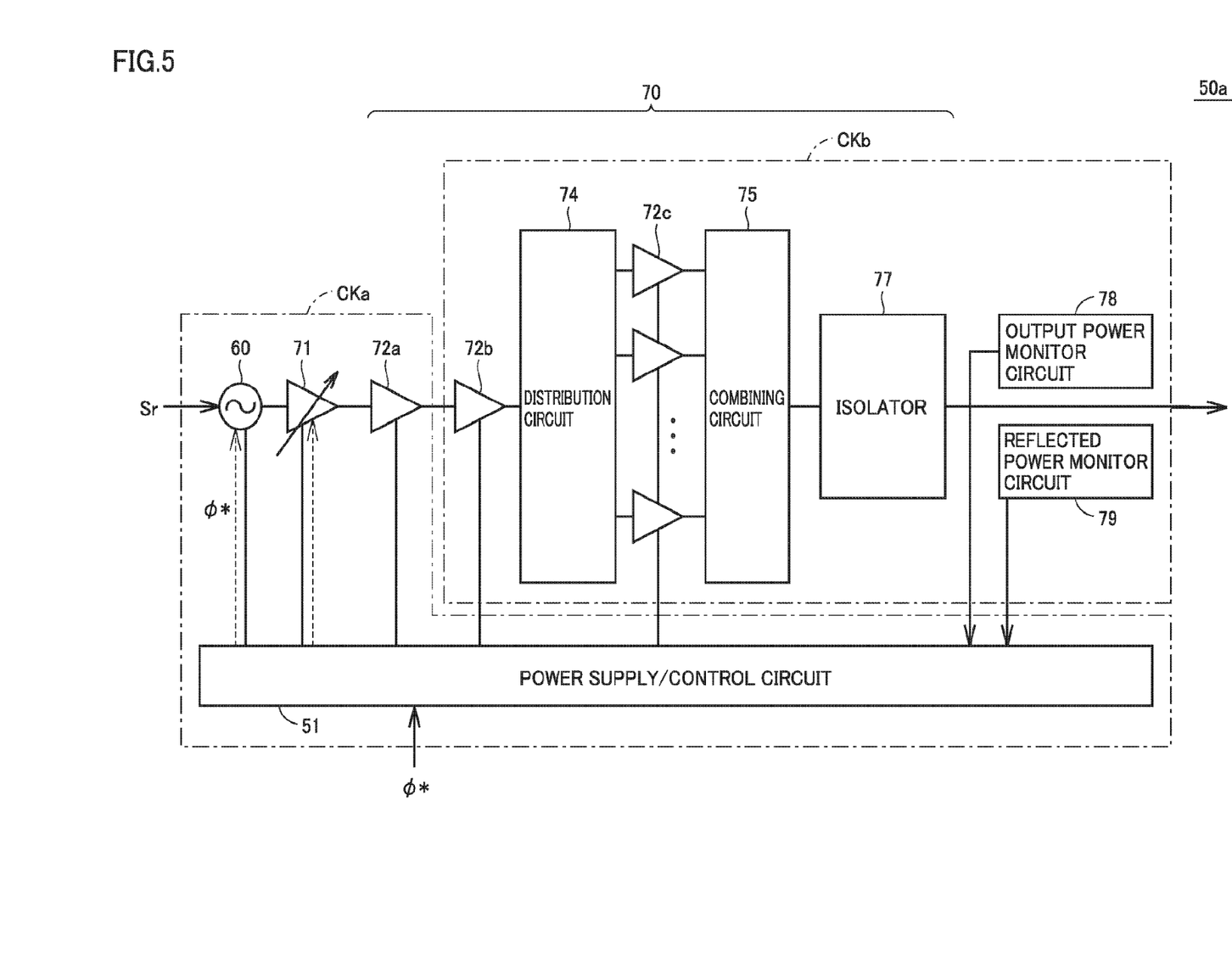
FIG. 5 is a circuit diagram illustrating the first modification of the oscillator module.

FIG. 5 is a circuit diagram illustrating the configuration of an oscillator module 50a in the first modification.

When comparing FIG. 5 with FIG. 3, oscillator module 50a according to the first modification is different from the configuration of oscillator module 50 (FIG. 3) according to the first embodiment in that this oscillator module 50a further includes a variable gain amplifier 71, an output power monitor circuit 78 and a reflected power monitor circuit 79. Since other configurations of oscillator module 50a are the same as those of oscillator module 50, the detailed description thereof will not be repeated.

Variable gain amplifier 71 is arranged between voltage controlled oscillator 60 and amplifier 72a. Variable gain amplifier 71 operates with the power supply received from power supply/control circuitry 51, to perform power amplification for the transmission high-frequency signal from voltage controlled oscillator 60 and output the resultant signal. The power amplification factor equivalent to the power ratio between the input signal and the output signal of variable gain amplifier 71 changes in accordance with the control signal from power supply/control circuitry 51.

In each oscillator module 50a, output power monitor circuit 78 measures the output power of the transmission high-frequency signal from amplification circuit 70. Reflected power monitor circuit 79 measures the reflected power from element antenna 90. The output power detected by output power monitor circuit 78 and the reflected power detected by reflected power monitor circuit 79 are input into power supply/control circuitry 51.

For example, output power monitor circuit 78 and reflected power monitor circuit 79 can be configured to extract a part of the output power and a part of the reflected power, respectively, using a directional coupler, and also configured to detect the extracted power using a wave detector.

Power supply/control circuitry 51 controls the power amplification factor of variable gain amplifier 71 based on at least one of the output power and the reflected power measured by output power monitor circuit 78 and reflected power monitor circuit 79, respectively.

For example, the voltage amplification factor obtained by variable gain amplifier 71 can be controlled such that the output power measured by output power monitor circuit 78 becomes equal to predetermined reference power. In this way, the output power of the transmission high-frequency signal from each oscillator module 50a can be precisely controlled according to the reference power suitable for forming various beams output from array antenna device 100. Alternatively, also in the environment in which a temperature changes, it becomes possible to compensate the change in output power of voltage controlled oscillator 60 and the change in gains of amplifiers 72a to 72c that are caused by the temperature dependency, so that the output power of the transmission high-frequency signal from oscillator module 50a can be maintained constant.

Furthermore, for the purpose of equipment protection control during occurrence of abnormalities, when at least one of the output power and the reflected power measured by output power monitor circuit 78 and reflected power monitor circuit 79 is higher than a predetermined threshold value, the power amplification factor of variable gain amplifier 71 is set to be 0 and the output of the transmission high-frequency signal is stopped, thereby allowing protection of oscillator module 50a against failures.

Figure 6:
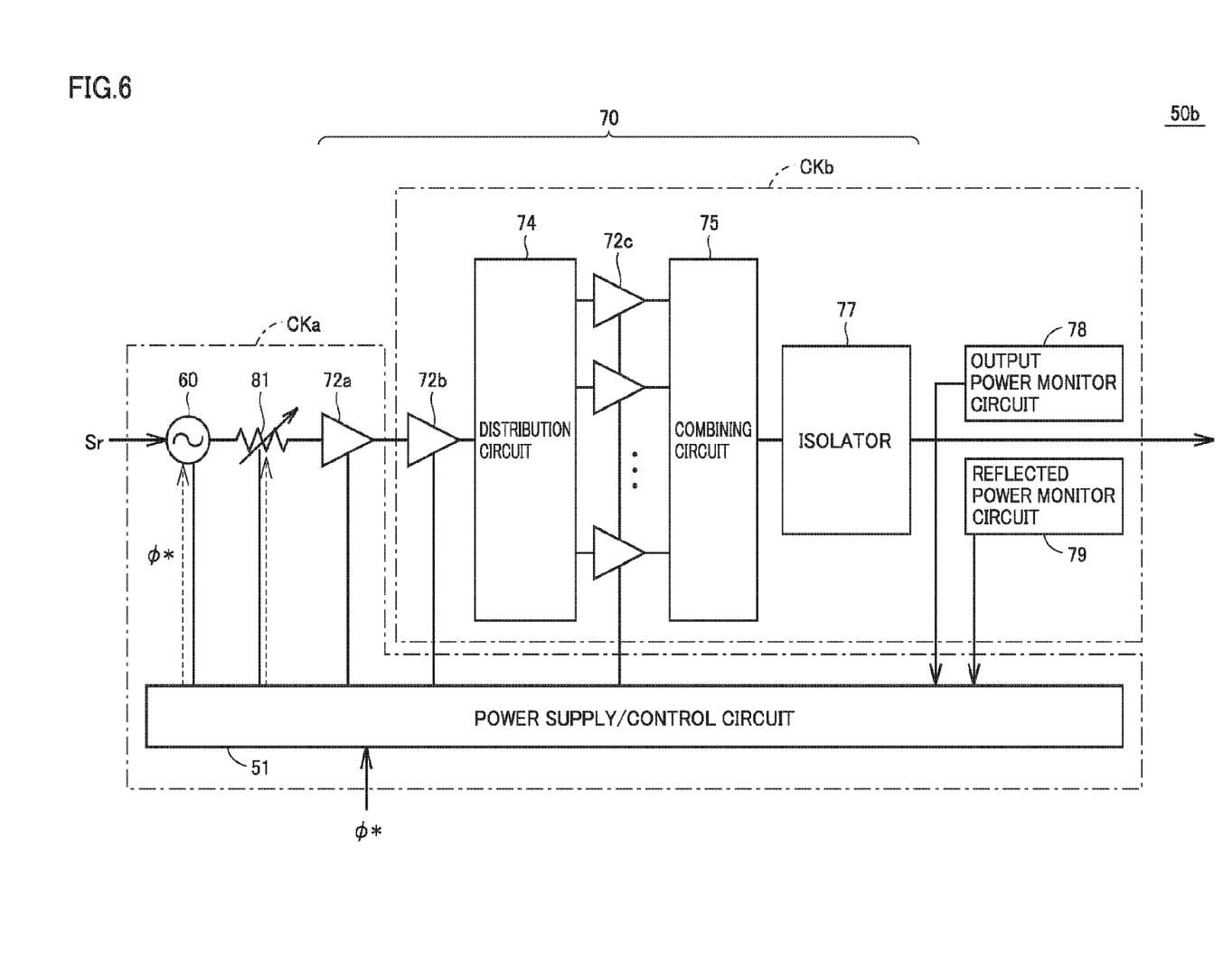
FIG. 6 is a circuit diagram illustrating the second modification of the oscillator module.

FIG. 6 is a circuit diagram illustrating the configuration of an oscillator module 50b in the second modification.

When comparing FIG. 6 with FIG. 5, oscillator module 50b according to the second modification is different from oscillator module 50a (FIG. 5) in that this oscillator module 50b includes a variable attenuator 81 in place of variable gain amplifier 71.

Variable attenuator 81 operates with the power supply received from power supply/control circuitry 51 to attenuate the power of the transmission high-frequency signal from voltage controlled oscillator 60. The power attenuation factor equivalent to the power ratio between the input signal and the output signal of variable attenuator 81 changes in accordance with the control signal from power supply/control circuitry 51. Since other configurations of oscillator module 50b are common to those of oscillator module 50a, the detailed description thereof will not be repeated.

In oscillator module 50b, the power attenuation factor in variable attenuator 81 can be controlled in accordance with the monitoring results obtained by output power monitor circuit 78 and reflected power monitor circuit 79 in the same manner as with the power amplification factor of variable gain amplifier 71 in oscillator module 50a. Accordingly, also in oscillator module 50b, the output power of the transmission high-frequency signal can be maintained at predetermined reference power. Alternatively, when the output power and/or the reflected power exceeds a threshold value, the power attenuation factor in variable attenuator 81 is set to be infinite, and the output of the transmission high-frequency signal from oscillator module 50b is stopped, thereby allowing execution of equipment protection control.

Figure 7:
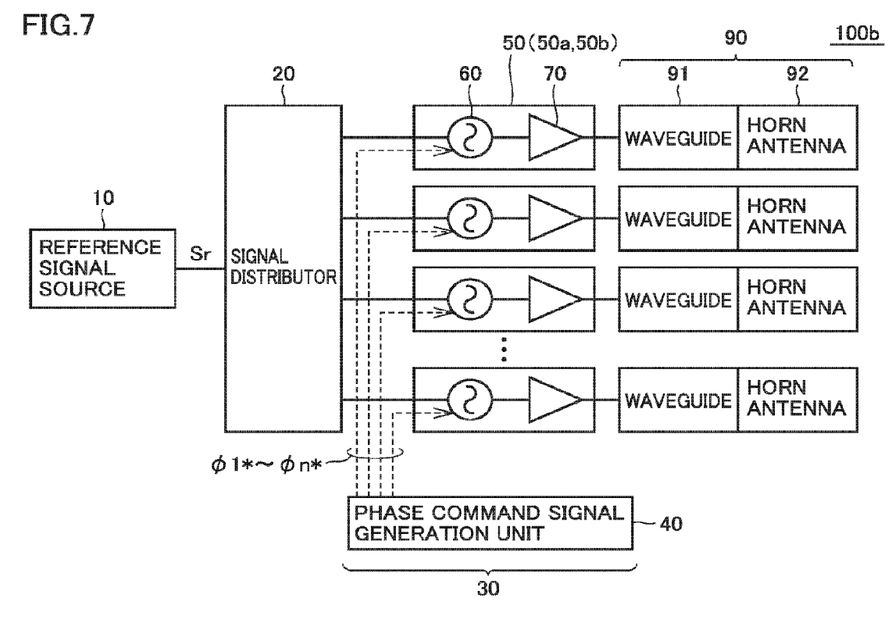
FIG. 7 is a block diagram illustrating the configuration of an array antenna device according to a modification of the first embodiment.

In this way, according to oscillator modules 50a and 50b in the modifications shown in FIGS. 6 and 7, variable gain amplifier 71 or variable attenuator 81 is further arranged, thereby allowing execution of precise control for the output power of the transmission high-frequency signal and also allowing equipment protection control under the excessive output power and reflected power. In the configurations in FIGS. 6 and 7, each of variable gain amplifier 71 and variable attenuator 81 corresponds to one embodiment of the "power regulator", and each of output power monitor circuit 78 and reflected power monitor circuit 79 corresponds to one embodiment of the "detector".

In addition, oscillator modules 50a and 50b according to the modifications shown in FIGS. 6 and 7 can also be configured according to the example of the mounting structure illustrated in FIG. 4. In this case, variable gain amplifier 71 and variable attenuator 81 are configured to amplify or attenuate the transmission high-frequency signal of relatively small electric power from voltage controlled oscillator 60 according to the control signal from power supply/control circuitry 51. Accordingly, it is preferable that such variable gain amplifier 71 and variable attenuator 81 are mounted on substrate 207 as circuit elements in circuit block CKa. On the other hand, output power monitor circuit 78 and reflected power monitor circuit 79 are configured to measure a relatively large electric power on the output side of amplification circuit 70. Accordingly, it is preferable that such output power monitor circuit 78 and reflected power monitor circuit 79 are mounted on substrate 210 as circuit elements in circuit block CKb.

Modification of First Embodiment

FIG. 7 is a block diagram showing the configuration of an array antenna device 100b according to a modification of the first embodiment of the present disclosure.

When comparing FIG. 7 with FIG. 1, array antenna device 100b according to the modification of the first embodiment is different from array antenna device 100a (FIG. 1) according to the first embodiment in that this array antenna device 100b includes a waveguide 91 and a horn antenna 92 as an element antenna 90. Since other configurations of array antenna device 100b are the same as those of array antenna device 100a, the detailed description thereof will not be repeated.

In addition, as a plurality of oscillator modules included in transmission module 30, array antenna device 100b also can employ the configuration of oscillator module 50a shown in FIG. 5 or oscillator module 50b shown in FIG. 6 in addition to the configuration of oscillator module 50 shown in FIG. 3.

In this way, even if the element antenna is formed of a horn antenna, transmission module 30 suitable for transmission not employing a baseband signal is used to output, from array antenna device 100b, a plurality of transmission high-frequency signals having the same frequency and having phases that are controlled independently from each other, so that a transmission beam can be formed.

Second Embodiment

In the first embodiment, an explanation has been given with regard to the configuration of the array antenna device for controlling a transmission beam by performing, in space, power combining of transmission high-frequency signals from the transmission modules according to the embodiment of the present disclosure. However, the transmission module according to the embodiment of the present disclosure can be applied not only to a spatial combining scheme but also to a high-power transmission device configured to perform power combining using a power combiner.

Figure 8:
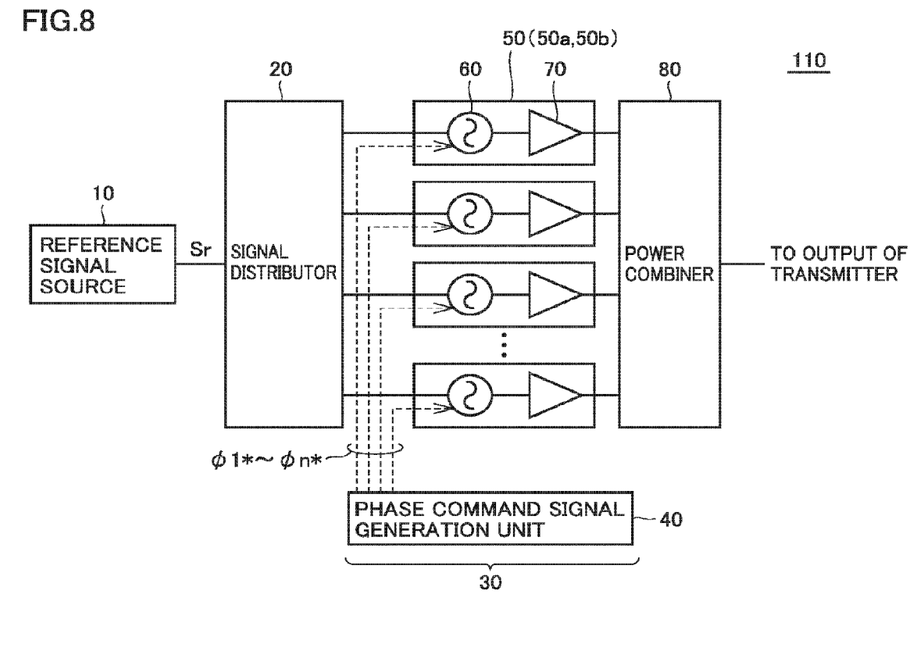
FIG. 8 is a block diagram illustrating the configuration of a transmission device according to the second embodiment.

FIG. 8 is a block diagram illustrating the configuration of a transmission device 110 according to the second embodiment, which is formed by including a transmission module according to an embodiment of the present disclosure.

Referring to FIG. 8, transmission device 110 according to the second embodiment includes a reference signal source 10, a signal distributor 20 and a transmission module 30 as in array antenna device 100a shown in FIG. 1. Furthermore, transmission device 110 includes a power combiner 80.

Transmission module 30, which is configured in a manner similar to the first embodiment, includes a plurality of (n) oscillator modules 50. Alternatively, transmission module 30 may be formed using oscillator module 50a (FIG. 5) or oscillator module 50b (FIG. 6) in place of oscillator module 50.

Unlike array antenna device 100, transmission device 110 is provided with power combiner 80 in place of n element antennas 90.

Power combiner 80 performs power combining of the outputs from n oscillator modules 50 (50a, 50b) to generate a transmission signal from transmission device 110. It is known that the output power from power combiner 80 reaches a maximum level when the phase condition among the input signals is optimized. Accordingly, when transmission module 30 is applied to transmission device 110, phase command signal generator 40 generates phase command signals φ1* to φn* such that the phase relation among the transmission high-frequency signals from n oscillator modules 50 (50a, 50b) is optimized at an input terminal of power combiner 80.

For example, when the output power from power combiner 80 is maximized when the in-phase signal is input, phase control command signals φ1* to φn* can be regulated such that n transmission high-frequency signals are actually aligned in phase at the input terminal of power combiner 80.

In this way, according to the transmission device in the second embodiment, transmission module 30 according to the present embodiment including oscillator module 50 (50a, 50b) is used to perform phase regulation at the input terminal of power combiner 80. Thereby, a transmission signal not including a baseband signal can be achieved at high output power by a compact, low-cost and low-loss circuit configuration.

Particularly, when the output power can be precisely controlled by applying oscillator modules 50a and 50b, an initial regulation of the reference power of the output from each of oscillator modules 50a and 50b can be carried out such that transmission high-frequency signals at the input terminal of power combiner 80 are equalized in amplitude. Thereby, the output power from power combiner 80 can be maximized, so that the transmission signal can be achieved at higher output power.

Third Embodiment

In the third embodiment, an explanation will be given with regard to the configuration in which the output power of each voltage controlled oscillator 60 can be controlled in each transmission module 30.

Figure 9:
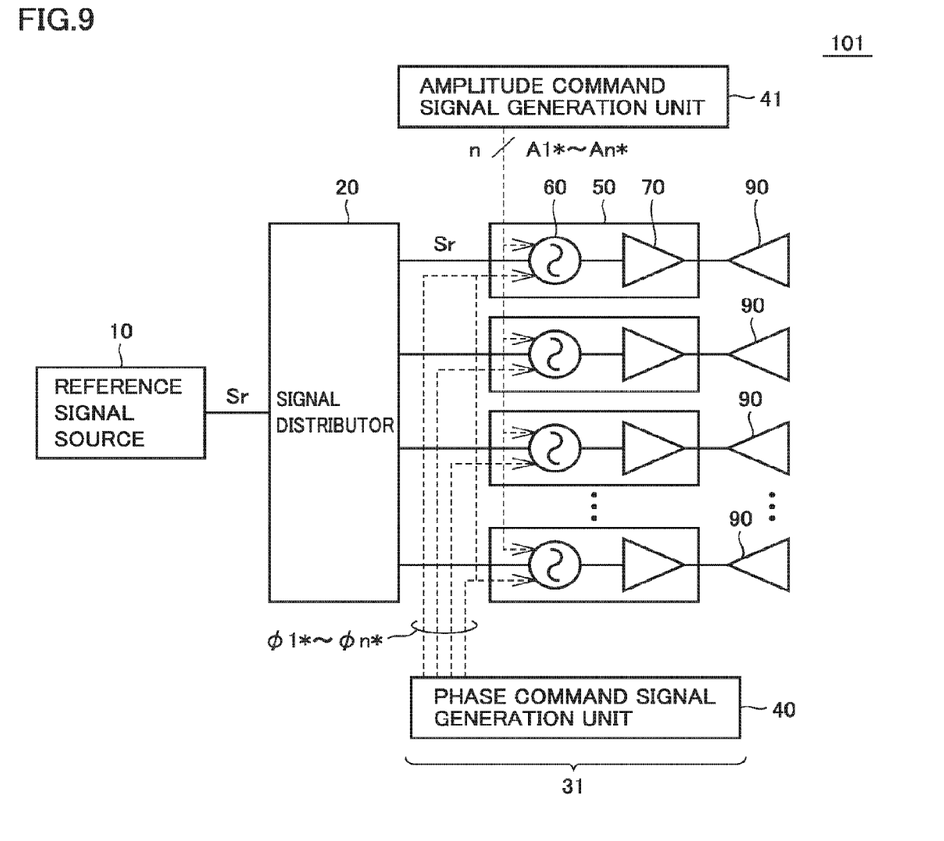
FIG. 9 is a block diagram illustrating the configuration of an array antenna device including a transmission module according to the third embodiment.

FIG. 9 is a block diagram illustrating the configuration of an array antenna device 101 including a transmission module according to the third embodiment.

When comparing FIG. 9 with FIG. 1, array antenna device 101 according to the third embodiment is different from array antenna device 100 according to the first embodiment in that this array antenna device 101 includes a transmission module 31 in place of transmission module 30. Transmission module 31 is different from transmission module 30 in that it further includes an amplitude command signal generator 41.

Amplitude command signal generator 41 generates amplitude command signals A1* to An* for voltage controlled oscillators 60 to n oscillator modules 50. Amplitude command signals A1* to An* are input into respective voltage controlled oscillators 60 in n oscillator modules 50.

In each of n oscillator modules 50, voltage controlled oscillator 60 outputs a transmission high-frequency signal having an amplitude in accordance with amplitude command signal A*(collectively representing A1* to An*). Thereby, the output power of the transmission high-frequency signal from each of voltage controlled oscillators 60 can be controlled separately in a corresponding one of n oscillator modules 50.

Since the configuration and the operation in each portion other than the above in array antenna device 101 are the same as those in array antenna device 100 (FIG. 1), the detailed description thereof will not be repeated.

In the array antenna device, when each element antenna 90 outputs equal output power, a side lobe may be increased in size. In such a case, when the output power from each of n oscillator modules 50 is intentionally changed in strength, the side lobe can be improved. For example, when the side lobe is improved by an amplitude distribution pattern in which the amplitude of the transmission high-frequency signal from element antenna 90 in the center portion is stronger than the amplitude of the transmission high-frequency signal from element antenna 90 in the peripheral portion, amplitude command signals A1* to An* can be set according to this amplitude pattern.

Thereby, according to the array antenna device in the third embodiment, a transmission beam with a small side lobe can be output by conducting separate control of the output power from voltage controlled oscillator 60 in each of oscillator modules 50.

Also in oscillator modules 50a and 50b shown in FIG. 5 and FIG. 6, the reference power in feedback control using the measured value obtained by output power monitor circuit 78 is set separately in n oscillator modules 50a and 50b in accordance with the above-mentioned amplitude pattern. Thereby, a transmission beam with a small side lobe can be similarly output. Conversely, in the configuration of the third embodiment, a transmission beam with a small side lobe can be output without having to arrange variable gain amplifier 71 or variable attenuator 81.

Figure 10:
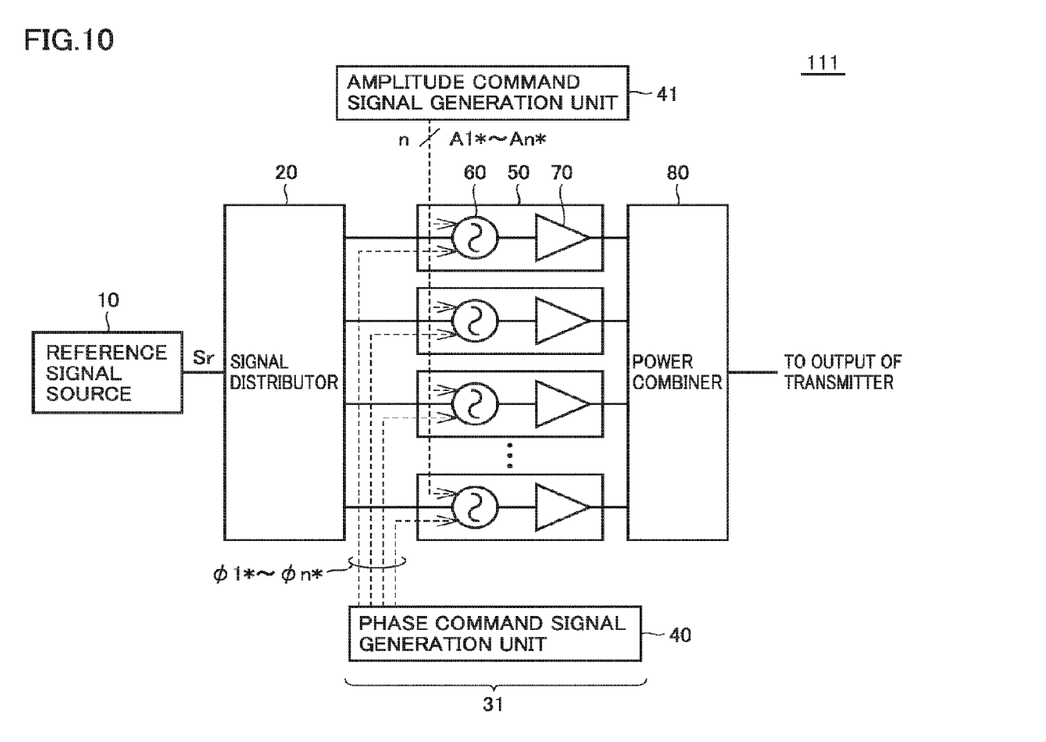
FIG. 10 is a block diagram illustrating the configuration of a transmission device including a transmission module according to the third embodiment.

FIG. 10 is a block diagram illustrating the configuration of a transmission device 111 including a transmission module according to the third embodiment.

When comparing FIG. 10 with FIG. 8, transmission device 111 according to the third embodiment is different from transmission device 110 according to the second embodiment in that this transmission device 111 includes a transmission module 31 in place of transmission module 30. Transmission module 31 is different from transmission module 30 in that this transmission module 31 further includes an amplitude command signal generator 41 as in FIG. 9. The output power of the transmission high-frequency signal from each of voltage controlled oscillators 60 can be controlled separately in a corresponding one of n oscillator modules 50.

Since the configuration and the operation in each portion other than the above in transmission device 111 are the same as those in transmission device 110 (FIG. 8), the detailed description thereof will not be repeated.

As described above, in the transmission device configured to generate a transmission signal by power combining, amplitude command signals A1* to An* can be regulated such that the transmission high-frequency signals from oscillator modules 50 are actually equalized in amplitude at the input terminal of power combiner 80.

Thereby, according to the transmission device in the third embodiment, the power of the transmission signal output from power combiner 80 can be maximized. Particularly, a transmission signal can be achieved at high output power using oscillator module 50 having a simple configuration without using oscillator modules 50a and 50b provided with variable gain amplifier 71 and variable attenuator 81, respectively.

It should be understood that the embodiments disclosed herein are illustrative and non-restrictive in every respect. The scope of the present disclosure is defined by the terms of the claims, rather than the description above, and is intended to include any modifications within the meaning and scope equivalent to the terms of the claims.

REFERENCE SIGNS LIST 10 reference signal source, 20, 65 signal distributor, 30, 31 transmission module, 40 phase command signal generator, 41 amplitude command signal generator, 50, 50a, 50b, 50# oscillator module, 51 power supply/control circuitry, 60 voltage controlled oscillator, 70 amplification circuit, 71 variable gain amplifier, 72a, 72b, 72c, 152, 153 amplifier, 74 distribution circuit, 75 combining circuit, 77 isolator, 78 output power monitor circuit, 79 reflected power monitor circuit, 80 power combiner, 81 variable attenuator, 90 element antenna, 91 waveguide, 92 horn antenna, 100, 100a, 100b, 100#, 101 array antenna device, 110, 111 transmission device, 151 phase shifter, 201 heat radiation fin, 202 metal base, 203 input-side connector plate 203a, 204a connector, 204 output-side connector plate, 206 metal plate, 207, 210 substrate, 208 metal cover, 211 sponge, A*, A1* to An* amplitude command signal, CKa, CKb circuit block, Sr reference signal.

The invention claimed is:

1. A transmission module comprising:
  a plurality of oscillator modules each configured to receive a common reference clock signal and output a corresponding one of a plurality of transmission signals; and
  a phase command signal generator configured to separately generate a plurality of phase command signals each corresponding to one of the plurality of transmission signals, and output each of the plurality of phase command signals to a corresponding one of the plurality of oscillator modules,
each of the plurality of oscillator modules including:
  a voltage controlled oscillator including an oscillator synchronously controlled by the reference clock signal, the oscillator being configured to output a corresponding transmission signal of the plurality of transmission signals based on the reference clock signal and a corresponding phase command signal of the plurality of phase command signals, and
  an amplification circuit configured to amplify power of the corresponding transmission signal output from the voltage controlled oscillator;
the voltage controlled oscillator being configured to output the plurality of transmission signals such that, by synchronous control based on the reference clock signal, the plurality of transmission signals have an equal frequency among the plurality of oscillator modules and have phases separately controlled among the plurality of oscillator modules according to the corresponding phase command signal.

2. The transmission module according to claim 1, wherein the voltage controlled oscillator comprises a phase locked loop (PLL) synchronously controlled by the reference clock signal.

3. The transmission module according to claim 1, wherein each of the plurality of oscillator modules further includes:
  a power regulator configured such that a power ratio between an input signal and an output signal can be regulated, and
  a detector configured to detect output power from each of the plurality of oscillator modules;
the power regulator is disposed on a signal path through which the corresponding transmission signal output from the voltage controlled oscillator passes, and
the power ratio of the power regulator is regulated based on a detected value by the detector.

4. The transmission module according to claim 3, wherein the power regulator is formed of one of a variable gain amplifier and a variable attenuator.

5. The transmission module according to claim 3, wherein each of the plurality of oscillator modules further includes:
  power supply/control circuitry configured to supply electric power and a control signal to a component element in each of the plurality of oscillator modules;
each of the plurality of oscillator modules is implemented by an integrated structure obtained by stacking a first substrate and a second substrate, at least some of circuit elements excluding the power regulator in the amplification circuit being mounted on the first substrate, and circuit elements in the voltage controlled oscillator, the power regulator and the power supply/control circuitry being mounted on the second substrate, and
the first substrate and the second substrate are spatially separated from each other by (i) a longitudinal wall formed of a conductive member formed on a ground pattern on the first substrate, and (ii) a plate, an input-side connector plate and an output-side connector plate that are used for covering the first substrate.

6. The transmission module according to claim 1, wherein each of the plurality of oscillator modules further includes:

a power regulator configured such that a power ratio between an input signal and an output signal can be regulated, and a detector configured to detect reflected power in each of the plurality of oscillator modules;

the power regulator is disposed on a signal path through which the corresponding transmission signal output from the voltage controlled oscillator passes, and the power ratio of the power regulator is regulated based on a detected value by the detector.

7. The transmission module according to claim 6, wherein each of the plurality of oscillator modules further includes:

power supply/control circuitry configured to supply electric power and a control signal to a component element in each of the plurality of oscillator modules;

each of the plurality of oscillator modules is implemented by an integrated structure obtained by stacking a first substrate and a second substrate, at least some of circuit elements excluding the power regulator in the amplification circuit being mounted on the first substrate, and circuit elements in the voltage controlled oscillator, the power regulator, and the power supply/control circuitry being mounted on the second substrate, and the first substrate and the second substrate are spatially separated from each other by (i) a longitudinal wall formed of a conductive member formed on a ground pattern on the first substrate, and (ii) a plate, an input-side connector plate and an output-side connector plate that are used for covering the first substrate.

8. The transmission module according to claim 1, further comprising:

an amplitude command signal generator configured to generate a plurality of amplitude command signals each for a corresponding one of the plurality of oscillator modules, and output each of the plurality of amplitude command signals to the voltage controlled oscillator included in a corresponding one of the plurality of oscillator modules, wherein the voltage controlled oscillator is configured to variably control an amplitude of the corresponding transmission signal according to a corresponding amplitude command signal of the plurality of amplitude command signals.

9. The transmission module according to claim 8, wherein each of the plurality of oscillator modules further includes:

power supply/control circuitry configured to supply electric power and a control signal to a component element in each of the plurality of oscillator modules;

each of the plurality of oscillator modules is implemented by an integrated structure obtained by stacking a first substrate and a second substrate, at least some of circuit elements in the amplification circuit being mounted on the first substrate, and circuit elements in the voltage controlled oscillator and the power supply/control circuitry being mounted on the second substrate, and the first substrate and the second substrate are spatially separated from each other by (i) a longitudinal wall formed of a conductive member formed on a ground pattern on the first substrate, and (ii) a plate, an input-side connector plate and an output-side connector plate that are used for covering the first substrate.

10. The transmission module according to claim 1, wherein each of the plurality of oscillator modules further includes:

power supply/control circuitry configured to supply electric power and a control signal to a component element in each of the plurality of oscillator modules;

each of the plurality of oscillator modules is implemented by an integrated structure obtained by stacking a first substrate and a second substrate, at least some of circuit elements in the amplification circuit being mounted on the first substrate, and circuit elements in the voltage controlled oscillator and the power supply/control circuitry being mounted on the second substrate, and the first substrate and the second substrate are spatially separated from each other by (i) a longitudinal wall formed of a conductive member formed on a ground pattern on the first substrate, and (ii) a plate, an input-side connector plate and an output-side connector plate that are used for covering the first substrate.

11. An array antenna device comprising:

a plurality of transmission modules according to claim 1; and a plurality of radiation elements, each of the plurality of radiation elements provided to correspond to one of the plurality of transmission modules, and arranged to propagate a corresponding one of the plurality of transmission signals from the plurality of oscillator modules to space.

12. A transmission device comprising:

a plurality of transmission modules according to claim 1; and a power combiner configured to combine the plurality of transmission signals from the plurality of transmission modules, the power combiner being arranged to propagate a combined signal to space.

13. A transmission module comprising:

a plurality of oscillator modules each configured to receive a common reference signal and output a corresponding one of a plurality of transmission signals; and a phase command signal generator configured to separately generate a plurality of phase command signals each corresponding to one of the plurality of transmission signals, and output each of the plurality of phase command signals to a corresponding one of the plurality of oscillator modules, each of the plurality of oscillator modules including:

a voltage controlled oscillator configured to output a corresponding transmission signal of the plurality of transmission signals based on the reference signal and a corresponding phase command signal of the plurality of phase command signals, and an amplification circuit configured to amplify power of the corresponding transmission signal output from the voltage controlled oscillator;

the voltage controlled oscillator being configured to output the plurality of transmission signals such that, by synchronous control based on the reference signal, the plurality of transmission signals have an equal frequency among the plurality of oscillator modules and have phases separately controlled among the plurality of oscillator modules according to the corresponding phase command signal wherein each of the plurality of oscillator modules further includes:

a power regulator configured such that a power ratio between an input signal and an output signal can be regulated, and a detector configured to detect reflected power in each of the plurality of oscillator modules;

the power regulator is disposed on a signal path through which the corresponding transmission signal output from the voltage controlled oscillator passes, and the power ratio of the power regulator is regulated based on a detected value by the detector.

14. The transmission module according to claim 13, wherein the power regulator is formed of one of a variable gain amplifier and a variable attenuator.

15. The transmission module according to claim 14, wherein each of the plurality of oscillator modules further includes:

power supply/control circuitry configured to supply electric power and a control signal to a component element in each of the plurality of oscillator modules;

each of the plurality of oscillator modules is implemented by an integrated structure obtained by stacking a first substrate and a second substrate, at least some of circuit elements in the amplification circuit being mounted on the first substrate, and circuit elements in the voltage controlled oscillator and the power supply/control circuitry being mounted on the second substrate, and the first substrate and the second substrate are spatially separated from each other by (i) a longitudinal wall formed of a conductive member formed on a ground pattern on the first substrate, and (ii) a plate, an input-side connector plate and an output-side connector plate that are used for covering the first substrate.

16. The transmission module according to claim 13, wherein each of the plurality of oscillator modules further includes:

power supply/control circuitry configured to supply electric power and a control signal to a component element in each of the plurality of oscillator modules;

each of the plurality of oscillator modules is implemented by an integrated structure obtained by stacking a first substrate and a second substrate, at least some of circuit elements in the amplification circuit being mounted on the first substrate, and circuit elements in the voltage controlled oscillator, the power regulator, and the power supply/control circuitry being mounted on the second substrate, and the first substrate and the second substrate are spatially separated from each other by (i) a longitudinal wall formed of a conductive member formed on a ground pattern on the first substrate, and (ii) a plate, an input-side connector plate and an output-side connector plate that are used for covering the first substrate.

17. The transmission module according to claim 16, further comprising:

an amplitude command signal generator configured to generate a plurality of amplitude command signals each for a corresponding one of the plurality of oscillator modules, and output each of the plurality of amplitude command signals to the voltage controlled oscillator included in a corresponding one of the plurality of oscillator modules, wherein the voltage controlled oscillator is configured to variably control an amplitude of the corresponding transmission signal according to a corresponding amplitude command signal of the plurality of amplitude command signals.

18. A transmission module comprising:

a plurality of oscillator modules each configured to receive a common reference signal and output a corresponding one of a plurality of transmission signals, and a phase command signal generator configured to separately generate a plurality of phase command signals each corresponding to one of the plurality of transmission signals, and output each of the plurality of phase command signals to a corresponding one of the plurality of oscillator modules, each of the plurality of oscillator modules including:

a voltage controlled oscillator configured to output a corresponding transmission signal of the plurality of transmission signals based on the reference signal and a corresponding phase command signal of the plurality of phase command signals, and an amplification circuit configured to amplify power of the corresponding transmission signal output from the voltage controlled oscillator;

the voltage controlled oscillator being configured to output the plurality of transmission signals such that, by synchronous control based on the reference signal, the plurality of transmission signals have an equal frequency among the plurality of oscillator modules and have phases separately controlled among the plurality of oscillator modules according to the corresponding phase command signal, wherein each of the plurality of oscillator modules further includes:

a power regulator configured such that a power ratio between an input signal and an output signal can be regulated, and a detector configured to detect output power from each of the plurality of oscillator modules;

the power regulator is disposed on a signal path through which the corresponding transmission signal output from the voltage controlled oscillator passes, and the power ratio of the power regulator is regulated based on a detected value by the detector, wherein each of the plurality of oscillator modules further includes:

power supply/control circuitry configured to supply electric power and a control signal to a component element in each of the plurality of oscillator modules;

each of the plurality of oscillator modules is implemented by an integrated structure obtained by stacking a first substrate and a second substrate, at least some of circuit elements excluding the power regulator in the amplification circuit being mounted on the first substrate, and circuit elements in the voltage controlled oscillator, the power regulator, and the power/and control circuitry being mounted on the second substrate, and the first substrate and the second substrate are spatially separated from each other by (i) a longitudinal wall formed of a conductive member formed on a ground pattern on the first substrate, and (ii) a plate, an input-side connector plate and an output-side connector plate that are used for covering the first substrate.

19. The transmission module according to claim 18, further comprising:

an amplitude command signal generator configured to generate a plurality of amplitude command signals each for a corresponding one of the plurality of oscillator modules, and output each of the plurality of amplitude command signals to the voltage controlled oscillator included in a corresponding one of the plurality of oscillator modules, wherein the voltage controlled oscillator is configured to variably control an amplitude of the corresponding transmission signal according to a corresponding amplitude command signal of the plurality of amplitude command signals.

* * * * *